US012701651B2

(12) United States Patent
Cader et al.

(10) Patent No.: US 12,701,651 B2
(45) Date of Patent: Aug. 4, 2026

(54) EFFICIENT THERMAL MANAGEMENT FOR VERTICAL POWER DELIVERY

(71) Applicant: Mellanox Technologies, Ltd., Yokneam (IL)

(72) Inventors: Tahir Cader, Spokane Valley, WA (US); David Paul Mohr, Houston, TX (US); Boaz Atias, Ma'ale Adumim (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 244 days.

(21) Appl. No.: 18/118,958

(22) Filed: Mar. 8, 2023

(65) Prior Publication Data

US 2024/0306287 A1 Sep. 12, 2024

(51) Int. Cl.
H05K 1/02 (2006.01)

(52) U.S. Cl.
CPC ..... H05K 1/0206 (2013.01); H05K 2201/066 (2013.01)

(58) Field of Classification Search
CPC ....................... H05K 1/0206; H05K 2201/066
USPC ......................................................... 361/710
See application file for complete search history.

(56) References Cited

U.S. PATENT DOCUMENTS

| | | | |
|---|---|---|---|
| 6,326,686 B1 * | 12/2001 | Baek | ..................... H01L 25/105 |
| | | | 257/E23.101 |
| 7,130,191 B2 * | 10/2006 | Lin | ....................... H01L 23/467 |
| | | | 257/E23.099 |
| 7,952,879 B1 * | 5/2011 | Vinciarelli | ............. H05K 7/209 |
| | | | 361/708 |
| 9,107,290 B1 * | 8/2015 | Chen | ..................... H05K 3/0061 |
| 10,199,904 B2 * | 2/2019 | Sasaki | ...................... H05K 1/09 |

(Continued)

FOREIGN PATENT DOCUMENTS

| | | | | |
|---|---|---|---|---|
| JP | 2017212376 A | * | 11/2017 | ........... H01L 23/367 |

OTHER PUBLICATIONS

"Multi-layered power module for vertical power delivery applications"; May 17, 2022 (Wayback Machine capture date); Technical Disclosure Commons; pp. 2-4 (Year: 2022).*

(Continued)

*Primary Examiner* — Mandeep S Buttar
*Assistant Examiner* — Kyle Oxenknecht
(74) *Attorney, Agent, or Firm* — Alston & Bird LLP

(57) ABSTRACT

Assemblies, systems, and methods are provided for dissipating heat from a PCB assembly. The PCB assembly may include a PCB comprising a first thermally conductive structure. A first heat generating component may be connected to the PCB and may be vertically disposed with respect to the PCB. The PCB may be disposed on a first side of the first heat generating component. The first thermally conductive structure may be configured to conduct heat laterally and cross-sectionally through the first thermally conductive structure toward a heat sink. A second thermally conductive structure may be disposed on a second side of the first heat generating component. The second thermally conductive structure may be configured to conduct heat laterally and cross-sectionally through the second thermally conductive structure into a heat sink. A heat sink configured to dissipate heat may be disposed between the first thermally conductive structure and the second thermally conductive structure.

20 Claims, 7 Drawing Sheets

(56)     References Cited

U.S. PATENT DOCUMENTS

| | | | | |
|---|---|---|---|---|
| 10,701,828 | B1 * | 6/2020 | Vinciarelli | H05K 5/065 |
| 11,171,118 | B2 * | 11/2021 | Yoo | H05K 3/4608 |
| 2010/0085713 | A1 * | 4/2010 | Balandin | H01L 23/373 |
| | | | | 257/E21.27 |
| 2013/0343000 | A1 * | 12/2013 | Shi | H01L 23/49833 |
| | | | | 361/717 |
| 2019/0204023 | A1 * | 7/2019 | Takken | F28F 3/04 |

OTHER PUBLICATIONS

Related U.S. Appl. No. 17/879,620, filed Aug. 2, 2022, entitled "Power Arrangement and Cooling System for Electronic Devices".

\* cited by examiner

EFFICIENT THERMAL MANAGEMENT FOR VERTICAL POWER DELIVERY

TECHNOLOGICAL FIELD

Example embodiments of the present disclosure relate generally to efficient thermal management for vertical power delivery implementation.

BACKGROUND

Modern high-performance computing (HPC) devices, such as graphics processing units (GPUs) and their active components, generate high degrees of heat during operation. As the demand for high throughput in HPC devices increases, so does the need for effective cooling systems. Applicant has identified numerous deficiencies and problems associated with conventional cooling systems. Through applied effort, ingenuity, and innovation, many of these identified problems have been solved by developing solutions that are included in embodiments of the present disclosure, many examples of which are described in detail herein.

BRIEF SUMMARY

Embodiments of the present disclosure are directed to thermal management for a vertical power delivery system, such as an assembly for thermal management of vertical power delivery and associated methods. In some embodiments, the system for dissipating heat from a printed circuit board (PCB) assembly may include a first thermally conductive structure configured to be disposed on a first side of a first heat generating component. The system may further include a second thermally conductive structure configured to be disposed on a second side of the first heat generating component, and a heat sink disposed between the first thermally conductive structure and the second thermally conductive structure. The first thermally conductive structure and the second thermally conductive structure may be configured to conduct heat laterally and cross-sectionally through the first and second thermally conductive structures toward the heat sink. The heat sink may be configured to dissipate the heat.

In some embodiments, the first thermally conductive structure is at least partially embedded in a PCB.

In some embodiments, the first thermally conductive structure comprises a first thermal plane, a second thermal plane, and a plurality of thermal vias extending through a thickness of the PCB and connecting the first thermal plane to the second thermal plane.

In some embodiments, the first thermal plane may comprise copper.

In some embodiments, the second thermal plane may comprise a plurality of thermally conductive layers of graphene and copper in alternating layers.

In some embodiments, the second thermally conductive structure may comprise a composite structure including a plurality of thermally conductive layers.

In some embodiments, at least one layer of the plurality of thermally conductive layers may comprise graphene.

In some embodiments, the second thermally conductive structure comprises a support structure.

In some embodiments, a surface of the first thermally conductive structure distal from the second thermally conductive structure may be configured to receive a second heat generating component.

In some embodiments, the first thermally conductive structure may be configured to be in thermal communication with the second heat generating component via a plurality of solder bumps.

In some embodiments, the heat sink is a first heat sink. The system may further comprise a second heat sink disposed on an opposite side of the second heat generating component with respect to the first thermally conductive structure. The second heat sink may be in thermal communication with the second heat generating component.

In some embodiments, the first heat generating component is a power supply and the second heat generating component is a graphics processing unit (GPU). In such cases, the PCB assembly may be configured for vertical power delivery.

A PCB assembly is also provided according to some embodiments. The PCB assembly may comprise a PCB comprising a first thermally conductive structure and a first heat generating component connected to the PCB and vertically disposed with respect to the PCB. The PCB may be disposed on a first side of the first heat generating component. A second thermally conductive structure may be disposed on a second side of the first heat generating component. The PCB assembly may further include a heat sink disposed between the first thermally conductive structure and the second thermally conductive structure. The first thermally conductive structure may be configured to conduct heat laterally and cross-sectionally through the first thermally conductive structure toward the heat sink. Additionally, the second thermally conductive structure may be configured to conduct heat laterally and cross-sectionally through the second thermally conductive structure toward the heat sink. The heat sink may be configured to dissipate the heat.

In some embodiments, the first thermally conductive structure comprises a first thermal plane, a second thermal plane, and a plurality of thermal vias extending through a thickness of the PCB and connecting the first thermal plane to the second thermal plane.

In some embodiments, the second thermally conductive structure comprises a composite structure including a plurality of thermally conductive layers.

In some embodiments, the first heat generating component is a power supply. The power supply may be disposed on a first side of the PCB. The PCB assembly may further comprise a GPU disposed on a second side of the PCB, such that the PCB assembly is configured for vertical power delivery.

In some embodiments, the heat sink is a first heat sink. The PCB assembly may further comprise a second heat sink disposed on an opposite side of the GPU with respect to the first thermally conductive structure.

A method of manufacturing a PCB assembly is also provided according to some embodiments. The method may include providing a PCB comprising a first thermally conductive structure. The method may further comprise connecting a first heat generating component to the PCB. The first heat generating component may be vertically disposed with respect to the PCB, and the PCB may be disposed on a first side of the first heat generating component. The method may further include disposing a second thermally conductive structure on a second side of the heat generating component and attaching a heat sink between the first thermally conductive structure and the second thermally conductive structure. The first thermally conductive structure may be configured to conduct heat laterally and cross-sectionally through the first thermally conductive structure toward the heat sink. The second thermally conductive structure may be configured to conduct heat laterally and cross-sectionally through the second thermally conductive structure toward the heat sink. The heat sink may be configured to dissipate heat.

In some embodiments, providing the PCB may comprise embedding the first thermally conductive structure within the PCB by embedding a first thermal plane, a second thermal plane, and a plurality of thermal vias through a thickness of the PCB to connect the first thermal plane to the second thermal plane.

In some embodiments, the first heat generating component is a power supply. The power supply may be disposed on a first side of the PCB, and the PCB assembly may further comprise a GPU disposed on a second side of the PCB. The PCB assembly may be configured for vertical power delivery.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Figure 1:
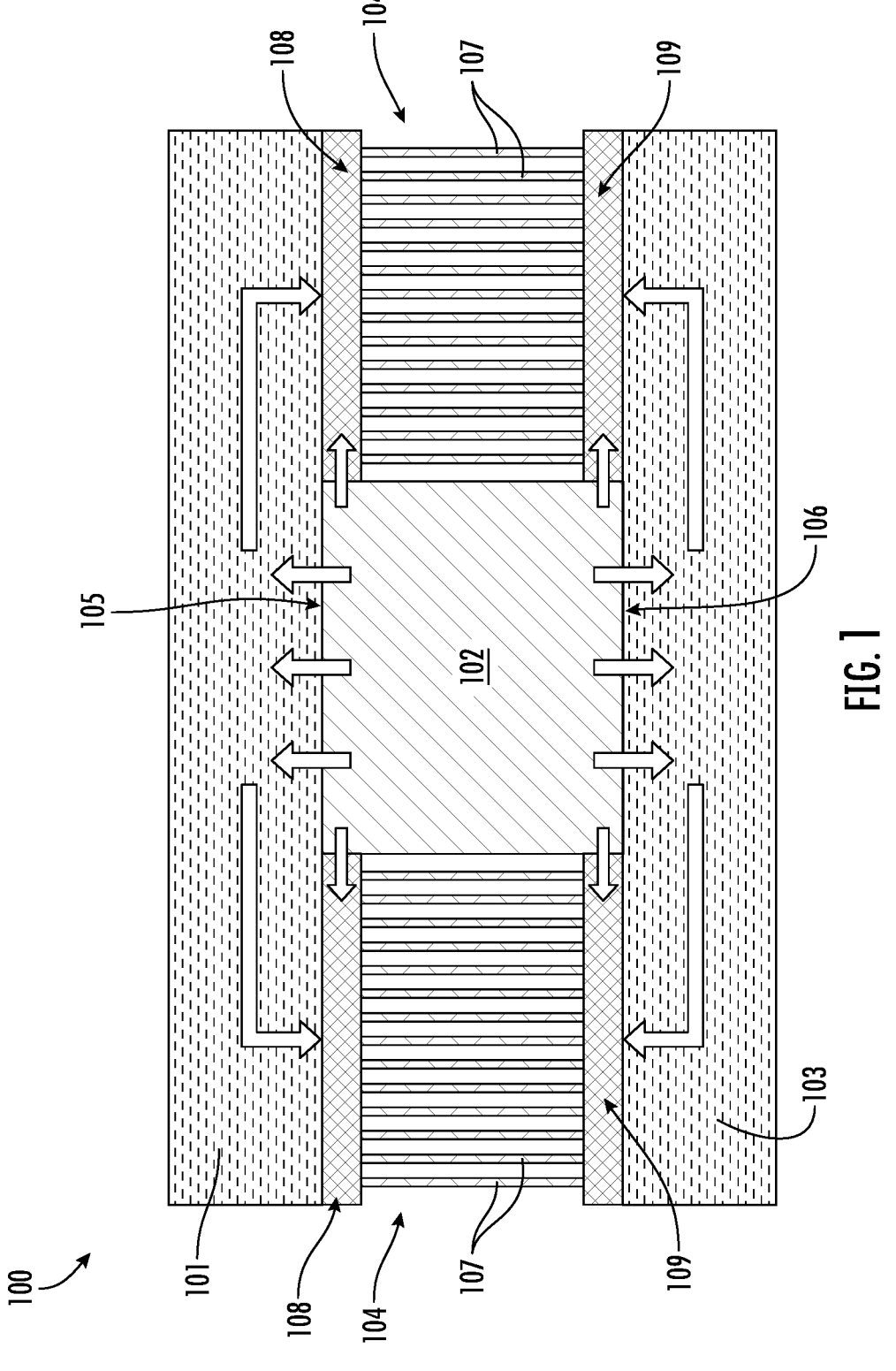
FIG. 1 is a schematic illustration of a system for dissipating heat from a PCB assembly including a first thermally conductive structure and a second thermally conductive structure in accordance with some embodiments described herein.

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

Printed circuit boards (PCBs) are the building blocks of electronic circuits. A PCB is a medium used to support electronic components and connect the components to one another to form a working circuit or assembly. PCBs may be configured in a number of ways and may be single-sided (one copper layer), double-sided (two copper layers), or multi-layer (outer and inner layers of copper, alternating with layers of substrate). Electrical components may be fixed to conductive pads on the outer layer of a PCB. The conductive pads, in turn, may have a shape designed to accept the components' terminals to both electrically connect and mechanically attach the electrical components to the PCB. The electrical connection and mechanical attachment may further be accomplished by soldering (a process by which two components are connected using a melted conductive material to attach the two components together) and/or using vias, which may refer to plated through-holes that allow interconnections between layers of the PCB.

In order for electrical components on a PCB to function properly, the components must receive power from a power supply and must be maintained at a temperature that is within a range of acceptable temperatures. An example of an electrical component is a graphics processing unit (GPU). GPUs are specialized electronic circuits that may be used for manipulation of computer graphics and image processing. GPUs may have a parallel structure and may be used in a wide range of applications such as graphics or video rendering. As a result of excessive heating of a GPU, lags and crashes may be experienced by a system connected to the GPU causing a reduction in overall performance. Excessive heating may, for example, diminish the capabilities and reduce the lifespan of the GPU. Additionally, the GPU may be damaged due to excessive heating. Increasing the power requirements for components such as GPUs has resulted in more heat being generated, which can have negative effects on the GPU and other components in the vicinity. For example, increased current at multiple lower voltages with very high dynamic characteristics may necessitate the use of high phase count voltage regulators. Moreover, in some cases, components such as the GPU are necessarily surrounded by power convertors. Each of these components generates heat during operation.

Power delivery systems for PCBs can be arranged in various configurations, depending on the desired functionality and application. In a vertical power delivery (VPD) system, for example, the power convertors are positioned under the GPU to reduce PCB losses. Such a configuration, however, couples the heat-producing power components to the GPU or other device. Moreover, the highly space-constrained environment of the VPD system configuration can make conventional heat dissipation solutions difficult to implement and thus requires a heat transfer system that uses as little space as possible. Without sufficient cooling mechanisms in place, as may be the case in conventional systems, the heat is transferred to the GPU, potentially reducing the GPU's overall performance and/or causing damage to the components as noted above.

In order to address these issues and others, embodiments of the present invention are directed to a system for dissipating heat from a PCB assembly, such a PCB assembly used in a VPD system, and associated PCB assemblies and methods of manufacturing PCB assemblies that provide for improved thermal management. As described in greater detail below, embodiments of the invention may provide for heat to be directed away from sensitive components that may generate and/or be affected by heat, such as GPUs, metal oxide semiconductor field effect transistors (MOSFETs), or power supplies. Although examples of embodiments of the invention as described herein refer to GPUs, MOSFETs, and power supplies as heat generating components, it will be understood by one skilled in the art in light of this disclosure that any number of other electronic components that produces heat as a current is passed therethrough may be heat generating components that may also benefit from embodiments of the present invention. Likewise, although the examples described herein refer to VPD systems, embodiments of the present invention may in some cases be applicable to power delivery systems having other configurations, such as lateral power delivery (LPD) systems.

As described in greater detail below, embodiments of the invention allow for heat generated by these components to be directed toward heat disposal elements such as heat sinks through thermally conductive structures designed for a space-constrained environment. The thermally conductive structures may include thermally conductive solder bumps, thermal planes embedded within the VPD layout, thermal vias, composite materials used to create thermal planes, heat sinks, and other elements within the VPD that may be used to direct heat away from potentially sensitive components. Through embodiments of the VPD thermal management implementation described herein, heat is directed away from sensitive components such as the GPU, enabling the GPU to run at higher operating levels without overheating and extending the lifespan of the GPU through a reduced thermal burden. The VPD thermal management system described herein may leverage numerous components to protect and reduce heat exposure of potentially sensitive materials within the VPD implementation.

With reference to FIG. 1, a system 100 for dissipating heat from a PCB assembly according to some embodiments is illustrated and described below. The system 100 may include a first thermally conductive structure 101 configured to be disposed on a first side 105 of a first heat generating component 102. As noted above, the first heat generating component 102 may, in some cases be a power supply, as described in greater detail below. The system 100 may further comprise a second thermally conductive structure 103 configured to be disposed on a second side 106 of the first heat generating component 102. As shown in FIG. 1, the system 100 may further include a heat sink 104 disposed and/or extending between the first thermally conductive structure 101 and the second thermally conductive structure 103.

The first thermally conductive structure 101 may contact or be otherwise thermally connected to the first heat generating component 102 so as to draw heat away from the first heat generating component. The thermal connection may include physical contact, a soldered connection, or other thermally conductive connections that may draw heat from the first heat generating component 102 and into the first thermally conductive structure 101 for transfer to a different component or structure, as described below. In this regard, the first thermally conductive structure 101 may be configured to conduct heat laterally and cross-sectionally through the first thermally conductive structure toward and/or into the heat sink 104. In some embodiments, the heat may be transferred (e.g., conducted) through the use of materials in the first thermally conductive structure 101 having a high thermal conductivity that are disposed against or in proximity to the first heat generating component 102. The first thermally conductive structure 101 may further transfer the heat from the first heat generating component 102 to a predetermined area of the VPD system where the heat may be dissipated, such as the heat sink 104. The first thermally conductive structure 101 may be configured in various ways, as described in greater detail below.

With continued reference to FIG. 1, the second thermally conductive structure 103 may include similar elements as and configured similarly to the first thermally conductive structure 101. In some embodiments, the second thermally conductive structure 103 may contact or be otherwise thermally connected to the first heat generating component 102 so as to draw heat away from the first heat generating component. As shown in FIG. 1, the second thermally conductive structure 103 may be placed on the opposite side of the first heat generating component 102 as compared to the first thermally conductive structure 101 (e.g., the first side 105 of the first heat generating component 102 may be opposite the second side 106 of the first heat generating component). The thermal connection may include physical contact, a soldered connection, or other thermally conductive connections that may draw heat from the first heat generating component 102 and into the second thermally conductive structure 103 for transfer to a different component or structure, as described below. In this regard, the second thermally conductive structure 103 may be configured to conduct heat laterally and cross-sectionally through the second thermally conductive structure toward and/or into the heat sink. In some embodiments, the heat may be transferred (e.g., conducted) through the use of materials in the second thermally conductive structure 103 having a high thermal conductivity that are disposed against or in proximity to the first heat generating component 102. The second thermally conductive structure 103 may further transfer the heat from the first heat generating component 102 to a predetermined area of the VPD system where the heat may be dissipated, such as the heat sink 104. The second thermally conductive structure 103 may be configured in various ways, as described in greater detail below.

In continued reference to FIG. 1, the heat sink 104 disposed between the first thermally conductive structure 101 and the second thermally conductive structure 103, as described above, may be configured to dissipate the heat (e.g., the heat from the first heat generating component 102). The heat sink 104 may be attached to the first thermally conductive structure 101 or the second thermally conductive structure 103. In other embodiments, the heat sink 104 may extend between and contact both the first thermally conductive structure 101 and the second thermally conductive structure 103, as depicted in FIG. 1. The heat sink 104 may, for example, comprise fins 107 that extend between a first planar portion 108 of the heat sink to a second planar portion 109 of the heat sink, as shown. The first planar portion 108 of the heat sink 104 may, in some embodiments, be disposed in thermal communication with (e.g., in contact with) the first thermally conductive structure 101. Similarly, second planar portion 109 of the heat sink 104 may, in some embodiments, be disposed in thermal communication with (e.g., in contact with) the second thermally conductive structure 103. As such, heat from the first thermally conductive structure 101 may pass into the first planar portion 108 of the heat sink 104 and into the fins 107, and heat from the second thermally conductive structure 103 may pass into the second planar portion 109 of the heat sink 104 and into the fins 107 where the heat will be dissipated (e.g., through cooling of the fins).

In some embodiments, such as the embodiment depicted in FIG. 1, the heat sink 104 may be divided into multiple parts. For example, in the depicted embodiments, half of the heat sink 104 is disposed on one side of the first heat generating component 102 and the other half disposed on the other side of the first heat generating component. As noted above, the heat sink 104 may comprise a number of fins 107, and the fins may have various configurations and arrangements in order to dissipate heat from the VPD system. The type of fins 107 used in the heat sink 104 may include extruded fins, stamped fins, bonded fins, folded fins, forged, swaged, skived, single fin assembly, or other types of fins. The material used for the heat sink 104 may include materials with a high heat capacity and high thermal conductivity, such as aluminum, aluminum alloys, copper, or others. The heat sink 104 may enable the dissipation of the heat, such as through cooling of the fins 107 due to air or another cooling medium passing through (in between) the fins. Although a heat sink 104 with fins 107 is described above, the heat sink 104 may further be a heat dissipation element such as a liquid cooled cold plate, a heat pipe, or other form of heat exchanger.

Figure 2:
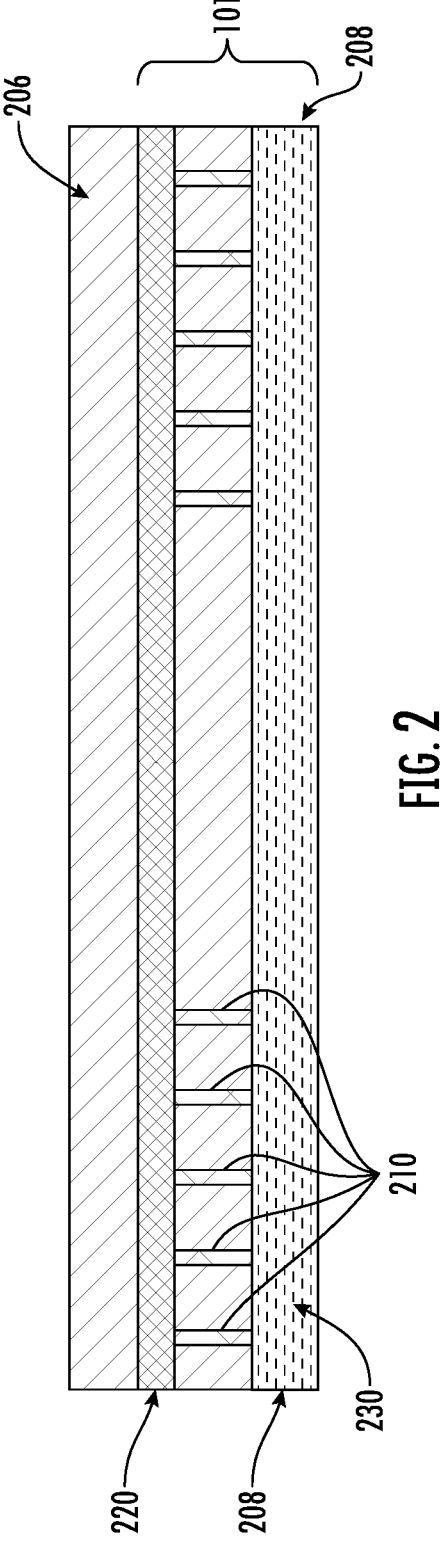
FIG. 2 is a schematic illustration of the first thermally conductive structure of FIG. 1 in accordance with some embodiments described herein.

With reference to FIGS. 1 and 2, in some embodiments the first thermally conductive structure 101 may be at least partially embedded in a PCB 206, such as the PCB to which the first heat generating component 102 (FIG. 1) is connected. In such embodiments, the PCB assembly 100 may comprise the PCB 206 comprising the first thermally conductive structure 101, a first heat generating component 102 connected to the PCB and vertically disposed with respect to the PCB, the second thermally conductive structure 103, and the heat sink 104 extending between the first thermally conductive structure and the second thermally conductive structure, as described above. In some embodiments, as shown in FIG. 2, the first thermally conductive structure 101 may comprise a first thermal plane 220 and a second thermal plane 230. In some embodiments, the first thermal plane 220 may be at least partially embedded within the PCB 206, as shown in FIG. 2. The first thermally conductive structure 101 may further include a plurality of thermal vias 210 extending through a thickness of the PCB 206 and connecting the first thermal plane 220 to the second thermal plane 230. The first thermal plane 220 may comprise copper, graphene, or another material with high thermal conductivity and for promoting the transfer of heat laterally (e.g., in an outward direction from a center of the first thermally conductive structure 101 toward the edges 208). The thermal vias 210 may be arranged perpendicularly with respect to the first thermal plane 220 and may extend toward the second thermal plane 230. The second thermal plane 230 may be a composite layer, which may be described in greater detail below.

In some embodiments, a thermal interface material (TIM) may be placed between the second thermal plane 230 and the heat sink 104 to promote the transfer of heat from the second thermal plane toward or into the heat sink. The TIM may be thermally conductive grease, a thermal compound, a thermal gel, a heat paste, a heat sink compound, a heat sink paste, or a CPU grease, for example. The TIM may encourage heat transfer cross-sectionally (e.g., in a vertical direction as depicted) as opposed to a primarily lateral direction through the second thermally conductive plane 230. A TIM may be used to promote heat transfer in other areas of the VPD arrangement beyond the second thermal plane 230 and the heat sink 104, such as between the first thermally conductive structure 101 and the heat sink, the second thermally conductive structure 103 and the heat sink, between the first heat generating component 102 and the heat sink, or between other parts of the VPD system in which the transfer of heat may be applicable. In other cases, the second thermal plane 230 may comprise TIM.

As noted above, the first thermal plane 220 may be configured to distribute heat in a lateral direction away from the center of the first thermally conductive structure 101. The first thermal plane 220 may further be configured to redistribute heat received from the PCB surroundings, such as from above or below the PCB 206. For example, heat from the first heat generating component 102 located below the first thermally conductive structure 101, as shown in FIG. 1, or from a second heat generating component placed above the center of the PCB 206, as described in greater detail below. The first thermal plane 220 may further transfer excess heat generated by or accumulated within the PCB 206, which may be transferred laterally through the first thermal plane and into the plurality of thermal vias 210.

The thermal vias 210 may be configured to transfer heat cross-sectionally from the first thermal plane 220 through the PCB 206 and into the second thermal plane 230. The number of thermal vias 210 and their arrangement along the PCB 206 may be selected and configured to optimize the removal of heat from potentially sensitive components of the PCB and the larger VPD system. The thermal vias 210 may be made of a material having a high thermal conductivity (such as aluminum or copper) to encourage heat conduction. The plurality of thermal vias 210 may be blind vias, or vias that are exposed on only one side of the PCB 206 (e.g., the side 210 closer to the second thermal plane 230). In some cases, the thermal vias 210 may be electrical vias (e.g., through holes lined in copper) that also serve to conduct heat from one end of the thermal via to the other.

As such, heat drawn into the first thermal plane 220 may be transferred through the thermal vias 210 to the second thermal plane 230, where the heat may then be removed from the VPD system through the use of a heat dissipating unit such as the heat sink 104 shown in FIG. 1. The second thermal plane 230 may, for example, comprise a thermal pad and may be configured to transfer heat to the heat sink 104 through a cross-sectional heat transfer. As noted above, the second thermal plane 230 may comprise a composite structure including a plurality of thermally conductive layers, such as layers of graphene and copper in alternating layers, as shown in FIG. 3 and described below.

Figure 3:
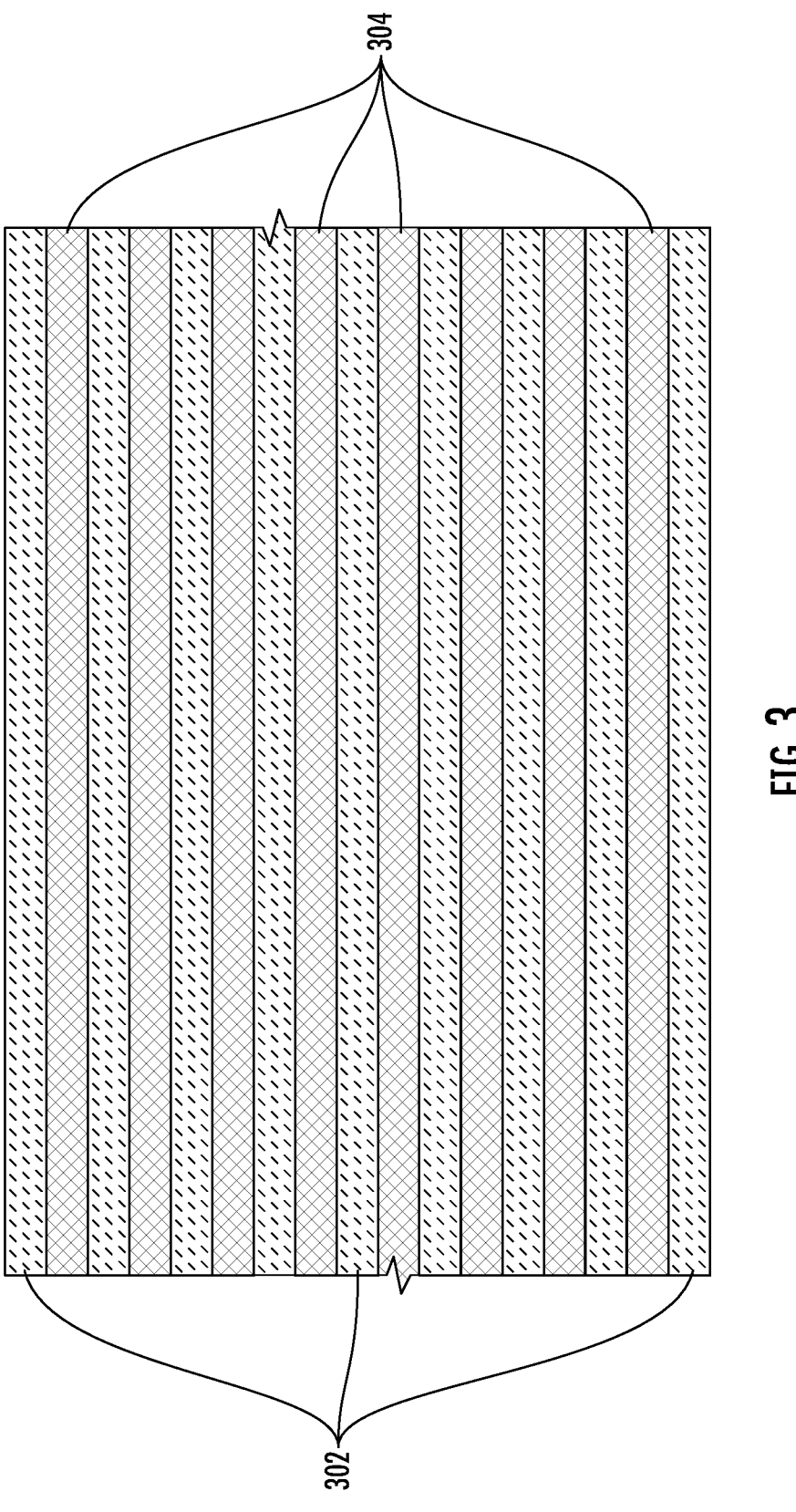
FIG. 3 is a schematic illustration of the second thermal plane of the first thermally conductive structure of FIG. 2 in accordance with some embodiments described herein.

With reference to FIG. 3, a cross-sectional view of a thermal plane, such as the second thermal plane 230 of FIG. 2, is shown. As noted above, the second thermal plane 230 may comprise a plurality of thermally conductive layers. For example, the second thermal plane may comprise a plurality of thermally conductive layers of graphene 302 and copper 304 in alternating layers. Solder may be used between the graphene 302 and copper 304 layers in order to secure the layers to each other to form the composite structure. In some embodiments, the thickness of the graphene 302 and copper 304 layers may be several times larger than the thickness of the solder. For example, the graphene 302 thickness may be 100 micrometers; the copper 304 thickness may be 50 micrometers; and the solder thickness may be between 5-25 micrometers.

Figure 4:
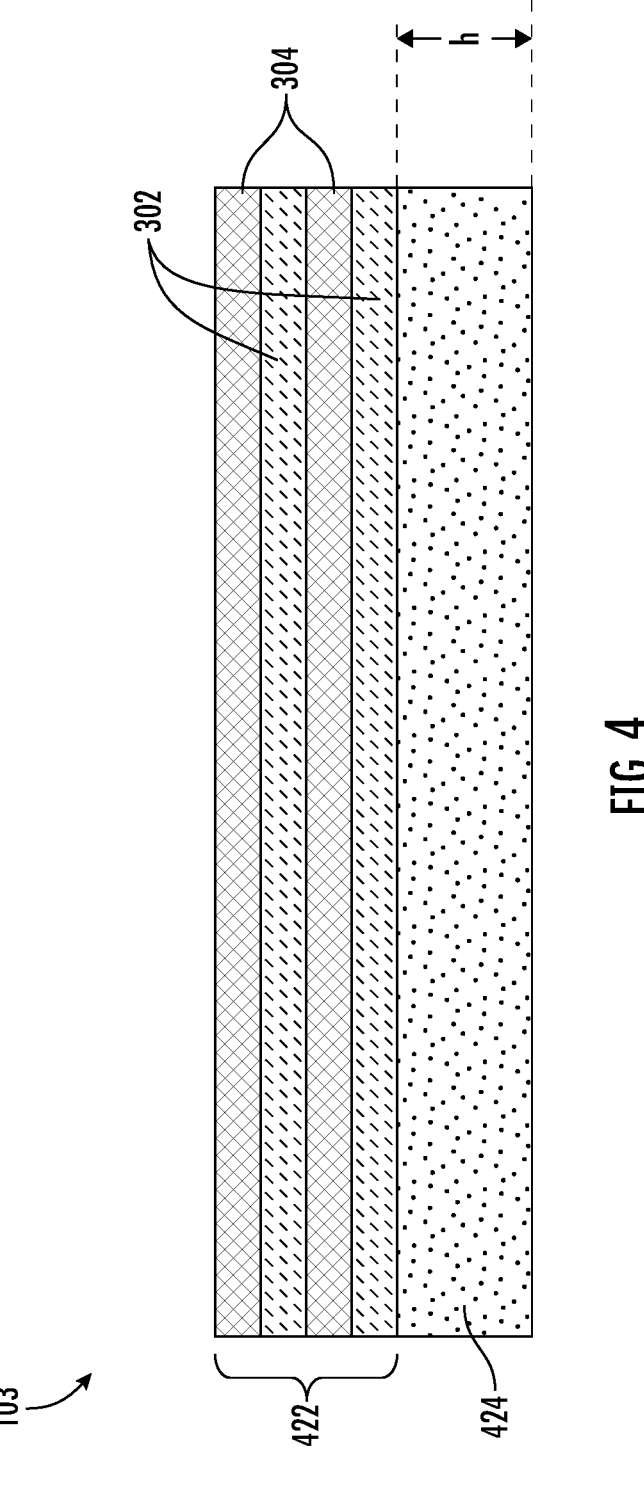
FIG. 4 is a schematic illustration of the second thermally conductive structure of FIG. 1 in accordance with some embodiments described herein.

With reference to FIGS. 1 and 4, the second thermally conductive structure 103 may comprise a composite structure 422 including a plurality of thermally conductive layers, similar to the configuration of the second thermal plane 230 shown in FIG. 3. At least one layer of the plurality of thermally conductive layers of the composite structure 422 of the second thermally conductive structure 103 may comprise graphene 302. As described above with respect to the second thermal plane 230 shown in FIG. 3, the graphene layers 302 may, in some embodiments, alternate with copper layers 304 to form the composite structure 422 of the second thermally conductive structure 103. The second thermally conductive structure 103 may further comprise a support structure 424, as shown in FIG. 4.

The support structure 424 may be configured to provide support and/or stability to the composite structure 422 to facilitate attachment of the second thermally conductive structure 103 to the first heat generating component 102 and/or the heat sink 104, shown in FIG. 1. In some embodiments, the support structure 424 may comprise a stiff material such as aluminum, steel, or other metal with physical characteristics that allow it to provide structural support. The support structure 424 may further be configured to promote thermal contact between the second thermally conductive structure 103, the first heat generating component 102, and the heat sink 104. In some cases, the support structure 424 may have a low profile (e.g., a shallow height h) and may, in some embodiments, be made up of thin sheets of material in order to minimize space. The composite structure 422 may be secured to the support structure 424 through soldering, welding, direct contact, or other attachment methods. In some embodiments, the support structure 424 may be a motherboard or a separate structure within the VPD in which the components described herein may be supported.

With reference to FIG. 1, the second thermally conductive structure 103 may be disposed on an opposite side of the first heat generating component 102 with respect to the first thermally conductive structure 101. The composite structure 422 (FIG. 4) of the second thermally conductive structure 103 may be disposed against (e.g., in contact with) the first heat generating component 102 and the heat sink 104. In some embodiments, the composite structure 422 may be soldered to the heat sink 104 and/or the first heat generating component 102 to promote thermal connection and conductance of heat away from the first generating component and into the composite structure of the second thermally conductive structure 103, which in turn may conduct the heat toward and into the heat sink 104 for dissipation.

Figure 5:
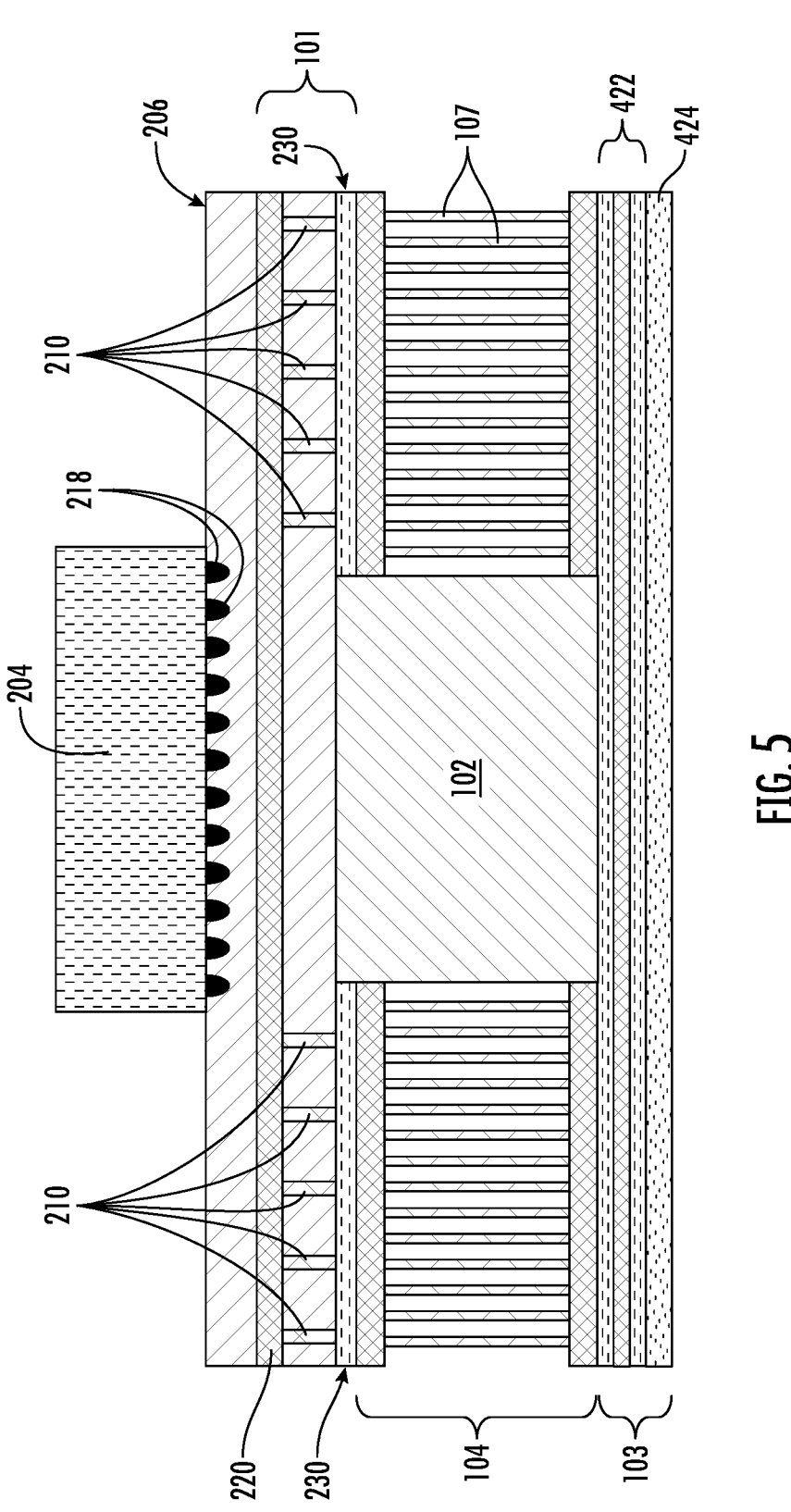
FIG. 5 is a schematic illustration of the system for dissipating heat from a PCB assembly including a second heat generating component in accordance with some embodiments described herein.

Referring now to FIG. 5, a system for dissipating heat from a PCB assembly in a VPD arrangement is illustrated in accordance with another embodiment. In the depicted embodiment, a surface of the first thermally conductive structure 101 distal from the second thermally conductive structure 103 may be configured to receive a second heat generating component 204. In some cases, for example, the first heat generating component 102 may be a power supply, and the second heat generating component 204 may be a GPU, such that the PCB assembly is configured for vertical power delivery. As such, the surface of the first thermally conductive structure 101 to which the second heat generating component 204 (e.g., the GPU) is attached may be on an opposite side of the first thermally conductive structure 101 with respect to the first heat generating component 102 (e.g., the power supply). The first thermally conductive structure 101 may be configured to be in thermal communication with the second heat generating component 204 (e.g., the GPU) via a plurality of solder bumps 218. The solder bumps 218 may be a series of thermally conductive solders, which may enable the transfer of heat from the second heat generating component 204 (e.g., the GPU) to the first thermal plane 220 within the first thermally conductive structure 101. The solder bumps 218 may further secure the second heat generating component 204 (e.g., the GPU) to the first thermally conductive structure 101.

Heat generated by the second heat generating component 204 may be transferred through the solder bumps 218 and into the first thermally conductive structure 101, for example, into the first thermal plane 220 embedded within the PCB 206. Heat transferred into the first thermal plane 220 may then be transferred to the thermal vias 210, which in turn may transfer heat into the second thermal plane 230 of the first thermally conductive structure 101. The second thermal plane 230 may then transfer the heat into the heat sink 104 for dissipation, as previously described.

As shown in FIG. 5, heat generated by the first heat generating component 102 (e.g., the power supply of the VPD system) may be transferred to either the first thermally conductive structure 101 or the second thermally conductive structure 103. The heat may then be transferred through the first thermally conductive structure 101, such as via the first thermal plane 220, into the thermal vias 210, and into the second thermal plane 230, which would then transfer the heat into the heat sink 104 for dissipation, as described above. On the other side of the first heat generating component 102 (e.g., the power supply), heat may be transferred to the second thermally conductive structure 103, such as via the composite structure 422. The composite structure 422 may then transfer the heat laterally outward and into the heat sink 104. In some cases, heat from the first heat generating component 102 may further be transferred directly into the heat sink 104, such as through direct contact on both sides of the first heat generating component with the heat sink or through other heat exchange mechanisms.

Figure 6:
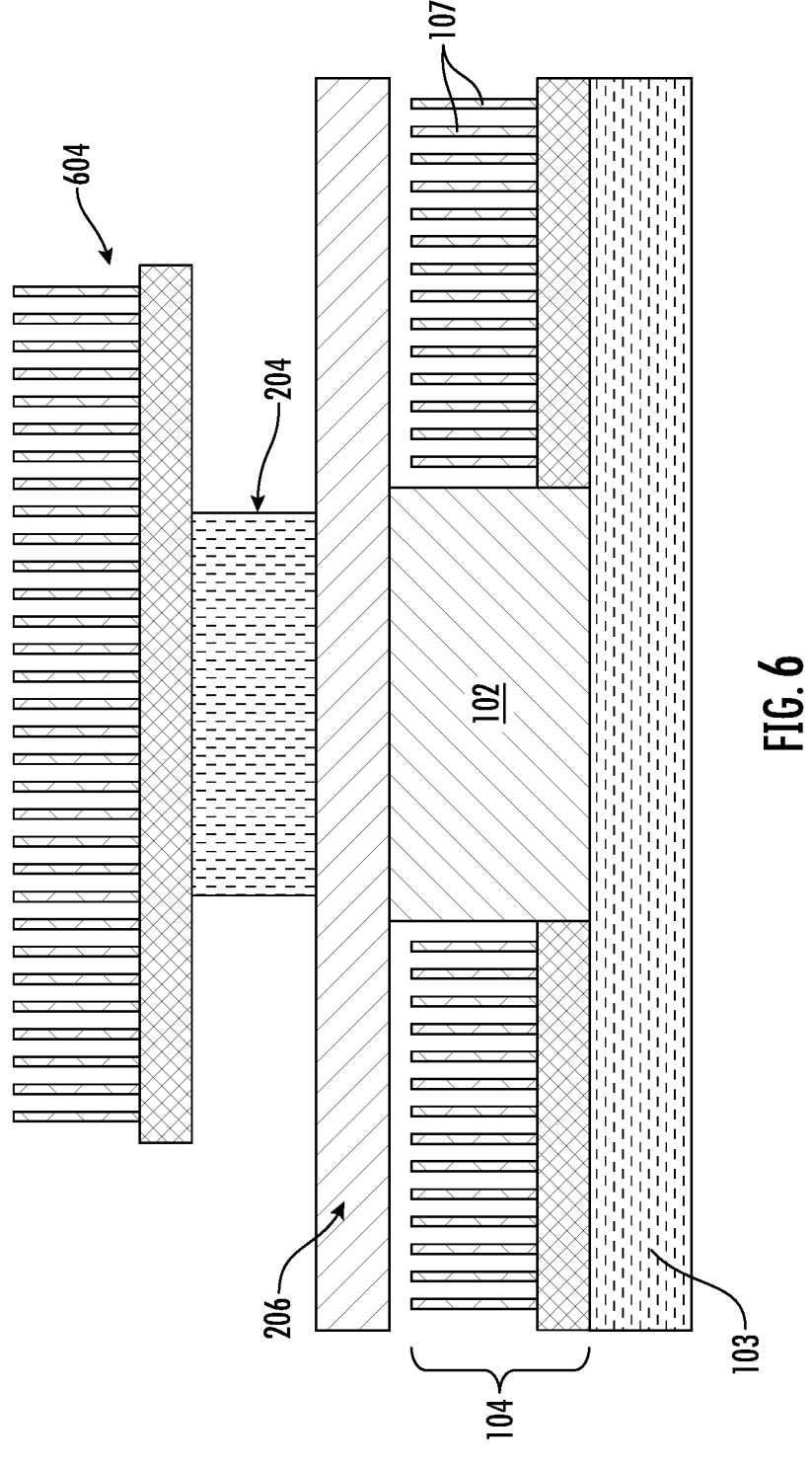
FIG. 6 is a schematic illustration of a system for dissipating heat from a PCB assembly having a second heat generating component and a second heat sink in accordance with some embodiments described herein.

With reference to FIG. 6, in some embodiments having a second heat generating component 204, a second heat sink 604 is provided to facilitate the removal of heat from the second heat generating component. In such embodiments, as described above with reference to FIG. 5, the PCB 206 may be connected to a first heat generating component 102 on one side and a second heat generating component 204 on the other side in a vertical configuration (e.g., according to a VPD arrangement). The first thermally conductive structure 101 may thus be disposed in thermal communication with the first heat generating component 102 on one side and with the second heat generating component 204 on the other side. The second thermally conductive structure 103 may be disposed in thermal communication with the opposite side of the first heat generating component 102, as depicted. In some embodiments, the heat sink 104 may be a first heat sink, which is attached to the second thermally conductive structure 103 for dissipating heat from the first heat generating component 102. The system according to some embodiments may further comprise a second heat sink 604 that is disposed on an opposite side of the second heat generating component 204 with respect to the first thermally conductive structure 101. The second heat sink 604 may be in thermal communication with the second heat generating component 204. As such, heat generated by the second heat generating component 204, in addition to being transferred to the first thermally conductive structure 101, may also be transferred toward the second heat sink 604. As described above in connection with FIG. 5, the first heat generating component 102 may be a power supply, and the second heat generating component 204 may be a GPU. The first heat sink 104 may be attached to the second thermally conductive structure 103 and may extend to the first thermally conductive structure 101, thereby contacting the first thermally conductive structure, or, in some cases, may not extend to contact the first thermally conductive structure 101. The first thermally conductive structure 101 may include similar thermally conductive elements described in FIG. 5, such as thermal planes within the PCB 206, thermal vias 210, or a composite structure 422 in the second thermal plane 230.

Figure 7:
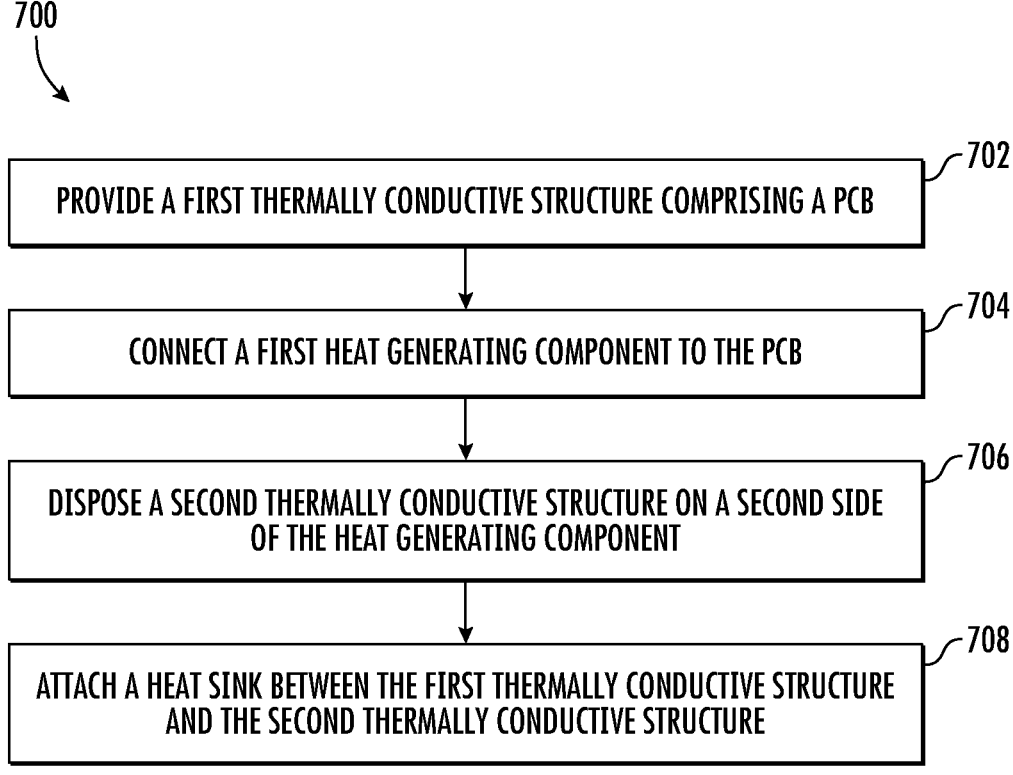
FIG. 7 is a flow chart illustrating a method of manufacturing a PCB assembly in accordance with some embodiments described herein.

With reference to FIG. 7, a method of manufacturing a PCB assembly is shown. The method may comprise providing a PCB comprising a first thermally conductive structure (Block 702). In some cases, the PCB may be manufactured to include the first thermally conductive structure and/or the thermal vias, such as by forming thermal vias that are integrally connected to thermally conductive materials within the PCB. As described above, the first thermally conductive structure 101 (FIG. 1) may be configured to conduct heat laterally and cross-sectionally through the first thermally conductive structure toward and/or into the heat sink. The method may further include connecting a first heat generating component to the PCB (Block 704). The first heat generating component may be vertically disposed with respect to the PCB, and the PCB may be disposed on a first side of the first heat generating component. A second thermally conductive structure may be disposed on a second side of the first heat generating component (Block 706). The second thermally conductive structure may be configured to conduct heat laterally and cross-sectionally through the second thermally conductive structure toward and/or into the heat sink. The method may further include attaching a heat sink between the first thermally conductive structure and the second thermally conductive structure (Block 708). As described in detail above, the first thermally conductive structure and the second thermally conductive structure may be configured to transfer heat into the heat sink, and the heat sink may be configured to dissipate the heat (e.g., the heat received from the first thermally conductive structure and/or the second thermally conductive structure).

As described above, providing the PCB may comprise embedding the first thermally conductive structure within the PCB by embedding a first thermal plane, a second thermal plane, and a plurality of thermal vias through a thickness of the PCB to connect the first thermal plane to the second thermal plane. Moreover, as described above, in some embodiments, the first heat generating component may be a power supply, and the power supply may be disposed on a first side of the PCB. The PCB assembly may further comprise a GPU disposed on a second side of the PCB, such that the PCB assembly is configured for vertical power delivery.

Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of any optical component or optoelectronic element. In addition, the methods described above may include fewer steps in some cases, while in other cases may include additional steps. Modifications to the steps of the method described above, in some cases, may be performed in any order and in any combination.

Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

That which is claimed:

1. A system for dissipating heat from a printed circuit board (PCB) assembly comprising:

a first thermally conductive structure directly contacting a first side of a first heat generating component;

a second thermally conductive structure directly contacting a second side of the first heat generating component; and a heat sink disposed between the first thermally conductive structure and the second thermally conductive structure, wherein the heat sink comprises a first planar portion, a second planar portion, and fins extending therebetween, wherein the first thermally conductive structure is configured to draw heat from the first side of the first heat generating component and conduct the heat from the first side of the first heat generating component laterally and cross-sectionally through the first thermally conductive structure toward the first planar portion of the heat sink, wherein the second thermally conductive structure is disposed fully below a surface of the second side of the first heat generating component and fully below the heat sink, wherein the second thermally conductive structure is configured to draw heat from the second side of the first heat generating component and conduct the heat from the second side of the first heat generating component laterally and cross-sectionally through the second thermally conductive structure toward the second planar portion of the heat sink, and wherein the heat sink is configured to dissipate the heat from the first side of the first heat generating component and the heat from the second side of the first heat generating component.

2. The system of claim 1, wherein the first thermally conductive structure is at least partially embedded in a PCB.

3. The system of claim 2, wherein the first thermally conductive structure comprises:

a first thermal plane configured for conducting the heat from the first side of the first heat generating component laterally through the first thermally conductive structure;

a second thermal plane disposed proximate the first planar portion of the heat sink, wherein the second thermal plane is configured for conducting the heat from the first side of the first heat generating component toward the first planar portion of the heat sink; and a plurality of thermal vias extending through a thickness of the PCB and connecting the first thermal plane to the second thermal plane.

4. The system of claim 3, wherein the first thermal plane comprises copper.

5. The system of claim 3, wherein the second thermal plane comprises a plurality of thermally conductive layers of graphene and copper in alternating layers.

6. The system of claim 1, wherein the second thermally conductive structure comprises a composite structure including a plurality of thermally conductive layers.

7. The system of claim 6, wherein at least one layer of the plurality of thermally conductive layers comprises graphene.

8. The system of claim 6, wherein the second thermally conductive structure comprises a support structure, wherein the support structure comprises a planar material attached to the composite structure to stabilize the composite structure.

9. The system of claim 1, wherein a surface of the first thermally conductive structure distal from the second thermally conductive structure is configured to receive a second heat generating component.

10. The system of claim 9, wherein the first thermally conductive structure is configured to be in thermal communication with the second heat generating component via a plurality of solder bumps.

11. The system of claim 9, wherein the heat sink is a first heat sink, wherein the system further comprises a second heat sink disposed on an opposite side of the second heat generating component with respect to the first thermally conductive structure, wherein the second heat sink is in thermal communication with the second heat generating component.

12. The system of claim 1, wherein the first heat generating component is a power supply, wherein a second heat generating component is a graphics processing unit (GPU), and wherein the PCB assembly is configured for vertical power delivery.

13. A PCB assembly comprising:

a PCB comprising a first thermally conductive structure;

a first heat generating component connected to the PCB and vertically disposed with respect to the PCB, wherein the PCB is disposed on a first side of the first heat generating component, and wherein the first thermally conductive structure is directly contacting the first side of the heat generating component;

a second thermally conductive structure directly contacting a second side of the first heat generating component; and a heat sink disposed between the first thermally conductive structure and the second thermally conductive structure, wherein the heat sink comprises a first planar portion, a second planar portion, and fins extending therebetween, wherein the first thermally conductive structure is configured to draw heat from the first side of the first heat generating component and conduct the heat from the first side of the first heat generating component laterally and cross-sectionally through the first thermally conductive structure toward the first planar portion of the heat sink, wherein the second thermally conductive structure is disposed fully below a surface of the second side of the first heat generating component and fully below the heat sink, wherein the second thermally conductive structure is configured to draw heat from the second side of the first heat generating component and conduct the heat from the second side of the first heat generating component laterally and cross-sectionally through the second thermally conductive structure toward the second planar portion of the heat sink, and wherein the heat sink is configured to dissipate the heat from the first side of the first heat generating component and the heat from the second side of the first heat generating component.

14. The PCB assembly of claim 13, wherein the first thermally conductive structure comprises:

a first thermal plane configured for conducting the heat from the first side of the first heat generating component laterally through the first thermally conductive structure;

a second thermal plane disposed proximate the first planar portion of the heat sink, wherein the second thermal plane is configured for conducting the heat from the first side of the first heat generating component toward the first planar portion of the heat sink; and a plurality of thermal vias extending through a thickness of the PCB and connecting the first thermal plane to the second thermal plane.

15. The PCB assembly of claim 13, wherein the second thermally conductive structure comprises a composite structure including a plurality of thermally conductive layers.

16. The PCB assembly of claim 13, wherein the first heat generating component is a power supply, wherein the power supply is disposed on a first side of the PCB, wherein the PCB assembly further comprises a GPU disposed on a second side of the PCB, such that the PCB assembly is configured for vertical power delivery.

17. The PCB assembly of claim 16, wherein the heat sink is a first heat sink, wherein the PCB assembly further comprises a second heat sink disposed on an opposite side of the GPU with respect to the first thermally conductive structure.

18. A method of manufacturing a PCB assembly comprising:

providing a PCB, wherein the PCB comprises a first thermally conductive structure;

connecting a first heat generating component to the PCB, wherein the first heat generating component is vertically disposed with respect to the PCB, wherein the PCB is disposed on a first side of the first heat generating component, and wherein the first thermally conductive structure is directly contacting the first side of the heat generating component;

disposing a second thermally conductive structure on a second side of the heat generating component such that the second thermally conductive structure is directly contacting the second side of the heat generating component; and attaching a heat sink between the first thermally conductive structure and the second thermally conductive structure, wherein the heat sink comprises a first planar portion, a second planar portion, and fins extending therebetween, wherein the first thermally conductive structure is configured to draw heat from the first side of the first heat generating component and conduct the heat from the first side of the first heat generating component laterally and cross-sectionally through the first thermally conductive structure toward the first planar portion of the heat sink, wherein the second thermally conductive structure is disposed fully below a surface of the second side of the first heat generating component and fully below the heat sink, wherein the second thermally conductive structure is configured to draw heat from the second side of the first heat generating component and conduct the heat from the second side of the first heat generating component laterally and cross-sectionally through the second thermally conductive structure toward the second planar portion of the heat sink, and wherein the heat sink is configured to dissipate the heat from the first side of the first heat generating component and the heat from the second side of the first heat generating component.

19. The method of claim 18, wherein providing the PCB comprises embedding the first thermally conductive structure within the PCB by embedding a first thermal plane, a second thermal plane, and a plurality of thermal vias through a thickness of the PCB to connect the first thermal plane to the second thermal plane.

20. The method of claim 18, wherein the first heat generating component is a power supply, wherein the power supply is disposed on a first side of the PCB, wherein the PCB assembly further comprises a GPU disposed on a second side of the PCB, such that the PCB assembly is configured for vertical power delivery.

\* \* \* \* \*